United States Patent [19]

Sukonick

[11] 4,295,135
[45] Oct. 13, 1981

[54] ALIGNABLE ELECTRONIC BACKGROUND GRID GENERATION SYSTEM

[76] Inventor: Josef Sukonick, 10395 Dempter Ave., Cupertino, Calif. 95014

[21] Appl. No.: 970,755

[22] Filed: Dec. 18, 1978

[51] Int. Cl.$^3$ .............................................. G06F 3/14
[52] U.S. Cl. .................................. 340/734; 340/721; 340/745; 340/703; 340/731
[58] Field of Search ............... 340/734, 722, 721, 745, 340/703, 726, 731, 709

[56] References Cited

U.S. PATENT DOCUMENTS

| | | | |
|---|---|---|---|
| 2,957,245 | 10/1960 | Kimble | 340/734 |
| 3,011,164 | 11/1961 | Gerhardt | 340/724 |
| 3,404,309 | 10/1968 | Massell et al. | 340/734 |
| 3,643,252 | 2/1972 | Roberts, Jr. | 340/734 |
| 3,858,198 | 12/1974 | Ross | 340/734 |
| 3,872,462 | 3/1975 | Lemelson | 340/734 |
| 4,146,879 | 3/1979 | Nicholson et al. | 340/734 |

*Primary Examiner*—Marshall M. Curtis
*Attorney, Agent, or Firm*—Howard A. Silber

[57] ABSTRACT

An alignable electronic background grid generation system, for use with a raster-type video graphics display unit on which graphic data is displayed, includes a horizontal grid line generator and a vertical grid pattern controller. An appropriate control device supplies to these components background grid parameter data including line spacing, line intensity pattern, and line offsets. Utilizing this data, the generator produces, in synchronism with horizontal video scanning of the display unit, grid intensity control signals indicating the requisite intensity of background grid spots at corresponding picture elements in the resultant display. These intensity control signals are modified in response to the output of the vertical grid pattern controller, which itself is synchronized to the vertical line clock of the video graphics display unit. The supplied grid parameter data can be altered as the location or size of the displayed graphic data is changed, so that the resultant background grid will remain aligned with the displayed graphic data.

31 Claims, 9 Drawing Figures

ALIGNABLE ELECTRONIC BACKGROUND GRID GENERATION SYSTEM

BACKGROUND OF THE INVENTION

1. Field of the Invention

The present invention relates to an alignable electronic background grid generation system for use with a computer graphics display.

2. Description of the Prior Art

Graphics display terminals are becoming widely used to display computer generated pictorial information. By displaying such information on a video cathode ray tube (CRT) display screen, the user can view the pictorial material essentially as soon as it is generated by the host computer. This is particularly advantageous when performing computer assisted design work, since changes in a design can be displayed pictorially as soon as they are made. Flexibility is enhanced by providing zoom and pan features which respectively allow "magnification" of the display and shifting or positional change in the portion of an image which is displayed.

For many applications, the presentation of a background grid as part of the video display is particularly beneficial. Such a grid may resemble graph paper, and serve as a background on which the pictorial information is overlaid. The grid provides a visible, dimensional reference for the pictorial display. By making every $n^{th}$ grid line (e.g., every fifth or tenth line) of higher intensity, the viewer's perception of overall position in the display is substantially enhanced. The dual intensity grid is particularly helpful when using the grid to measure larger distances. For many applications, grids of equal spacing between lines is preferred. For other applications, spacings which are function-related, such as logarithmic, are preferred.

Certain background grid techniques have been used in the past. The simplest is a physical overlay, typically in the form of a transparent plastic sheet having a ruled grid pattern, which sheet is physically mounted across the face of the CRT. Although providing a reference scale, such approach is particularly undesirable for several reasons. First, the scale is in no way aligned with the underlying picture. Thus, for example, to align the origin of a displayed graph or image with a particular grid intersection requires physical movement of the overlay or a shift in position of the entire video display, which may or may not be possible depending on the type of video generation scheme that is used. Secondly, the accuracy of measurement using the grid is limited by parallax. Further, the grid spacing, and its relationship to the edge of the video image, both are fixed. Therefore, if a different display scale or magnification is used, or if the image position is moved or panned, a completely different transparent overlay grid may be required, or the position of the overlay must be moved to compensate for such image panning.

Certain electronic background grid generation schemes also are known in the prior art. For example, the grid itself may be generated and stored as an integral part of the displayed image. This requires the computer directly to generate the entire grid information as it is generating the desired pictorial image, to integrate these with one another, and to store the resultant combined pictorial image and grid background as a unitary pattern in a display memory. Although this eliminates the problems of parallax and grid-to-picture misalignment, it introduces other complications. For example, the grid will be presented with the same intensity as the pictorial image. As a result, rather than aiding interpretation of the image, the equal intensity background grid may well obscure the pictorial data. Although this problem can be cured by storing intensity information for the grid in the display memory, that approach would require the entire display memory to be capable of storing multi-bit intensity information for each individual picture element ("pixel"). The computer must generate separate intensity information for each grid and pictorial image pixel. Obviously, greater computer speed and complexity is required, and the display memory itself is more complex and hence of higher cost.

In addition, this prior art approach is not readily amenable to changes in grid scale factor or grid offset from the edge of the display. If a different scale factor or offset is desired, the entire image, including both grid and pictorial data, must be totally recomputed.

An object of the present invention is to provide an electronic background grid generation system having the following features, among others:

1. The background grid is generated totally independently of the displayed pictorial image; yet 2. The grid is exactly aligned with the underlying picture;

3. Individual grid lines may be displayed with different intensities, e.g., so as to resemble drafting paper;

4. The grid has completely selectable scale factors, including selectable spacing between adjacent grid lines, and selectable control of the number of lesser intensity grid lines between each line of greater intensity;

5. The grid scale factors may be controlled automatically to conform with the pictorial image magnification factor in a zoom system, so that when a magnified display is selected, the background grid will automatically conform to the changed size of the zoomed image;

6. The grid offset from the side and top or bottom of the display screen can be separately controlled. This permits operator or computer selection of the spacing between the image edge and the first minor (i.e., lesser intensity) and first major (i.e., greater intensity) grid lines. This function enables the background grid to be maintained in exact alignment with an image as it is panned across the display screen;

7. Any grid line spacing can be implemented, so as to produce background grids of equal spacing or of functional spacing such as logarithmic;

8. Grid generation may be implemented either in real time or in non-real time, the latter approach substantially reducing the requisite high speed logic requirements without sacrificing display flexibility;

9. The background grid may be restricted to only a portion of the total displayed image, e.g., to leave a display area available for alphanumeric presentation without a background grid which would be objectionable in this region;

10. Different background grid patterns may be generated simultaneously in different zones of the screen; and 11. The background grid intensity and mixing functions can be chosen to permit the pictorial image to be seen through the grid.

SUMMARY OF THE INVENTION

These and other objectives are achieved by providing an alignable electronic grid generation system, for use with a video graphics display unit, which generates the background grid independently of the displayed pictorial data. The system is synchronized with the video raster timing pulses, and produces intensity control signals, corresponding to the desired grid pattern, which are mixed with the video signals representing the pictorial data to produce a composite display in which the pictorial image is displayed with a background grid of lesser intensity.

The grid generation circuitry is controllable to effect the following grid parameters:

a. the x-minor grid size, i.e., the number of pixels between each vertical grid line;

b. the x-minor grid offset, i.e., the number of pixels between a vertical edge of the display and the first vertical grid line;

c. the number of vertical grid lines of lesser intensity for each vertical line of greater intensity;

d. the x-major grid offset, i.e., the number of lesser intensity grid lines between a vertical edge of the display and the first vertical grid line of greater intensity;

e. the y-minor grid size, i.e., the number of video raster scan lines between adjacent horizontal grid lines;

f. the y-minor grid offset, i.e., the number of raster lines between the top (or bottom) of the video display and the first horizontal grid line;

g. the number of horizontal grid lines of lesser intensity for each horizontal line of greater intensity; and h. the y-major grid offset, i.e., the number of lesser intensity horizontal grid lines between the top (or bottom) of the display and the first horizontal line of greater intensity.

Any or all of these grid parameters may be altered under computer control. This facilitates automatic modification of the background grid to conform to changes in dimension or position of the displayed pictorial image. In this manner, the grid display can be synchronized and aligned with the displayed picture during both zoom and pan operation.

In a real time embodiment, appropriate logic circuitry calculates each grid line location and intensity in synchronism with the video raster scan clock. These calculations are performed using as inputs appropriate preselected grid data and offsets which define the grid parameters listed above. The circuitry produces minor grid and major grid intensity control signals which, when mixed with the video signals defining the pictorial data, produce a composite display having an exactly aligned background grid.

In an alternative non-real time generation system, data defining a single horizontal grid line of the requisite grid parameters is stored in a memory. The memory then is accessed repetitively during raster generation of each scan line for which a horizontal grid line is to be produced. The accessed data is used to produce the requisite minor grid and major grid intensity control signals. A separate memory or other appropriate control circuitry, synchronized with the video line clock, cooperates with the first memory to inhibit horizontal grid line generation during raster line scans for which no horizontal grid line is desired, and to intensify the horizontal grid line at requisite locations.

BRIEF DESCRIPTION OF THE DRAWINGS

A detailed description of the invention will be made with reference to the accompanying drawings wherein:

FIGS. 1A and 1B illustrate the automatic relocation of the background grid during panning, and FIG. 1C illustrates the automatic change in scale of the background grid during zoom operation.

In FIG. 5 a portion of the background grid is blanked, while in FIG. 6, two grids of different sizes are present in a single display.

DESCRIPTION OF THE PREFERRED EMBODIMENTS

The following detailed description is of the best presently contemplated modes of carrying out the invention. This description is not to be taken in a limiting sense, but is made merely for the purpose of illustrating the general principles of the invention since the scope of the invention best is defined by the appended claims.

Figure 1A:
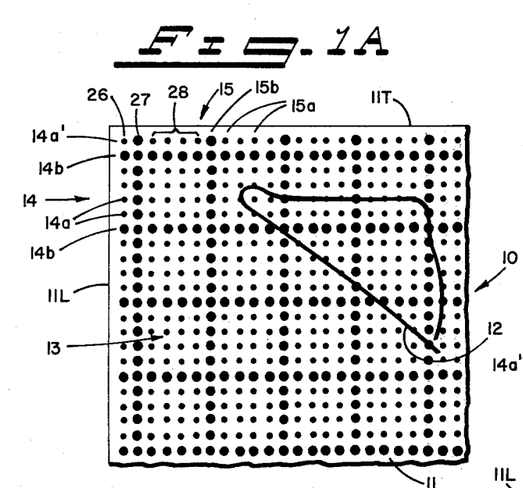
FIGS. 1A, 1B and 1C show portions of a video graphics display in which a pictorial image overlays a background grid produced by the inventive system.

In FIG. 1A there is shown a portion of a video graphics display 10 which may be produced on the face 11 of a CRT display screen by a graphics display unit employing the inventive electronic grid generation system. The display includes arbitrary pictorial data 12 superimposed on a background grid 13. In this typical display, the grid 13 includes an array of horizontal lines 14 and vertical lines 15. For each four horizontal lines 14a of lesser intensity there is a horizontal line 14b of relatively greater intensity. Similarly, for each four vertical lines 15a of relatively lesser intensity there is a vertical grid line 15b of relatively greater intensity. The picture is a video composite of the pictorial image 12 with the grid lines 14 and 15, with the pictorial, minor grid and major grid intensities being adjustable so that the pictorial image is viewable through the grid.

Figure 3:
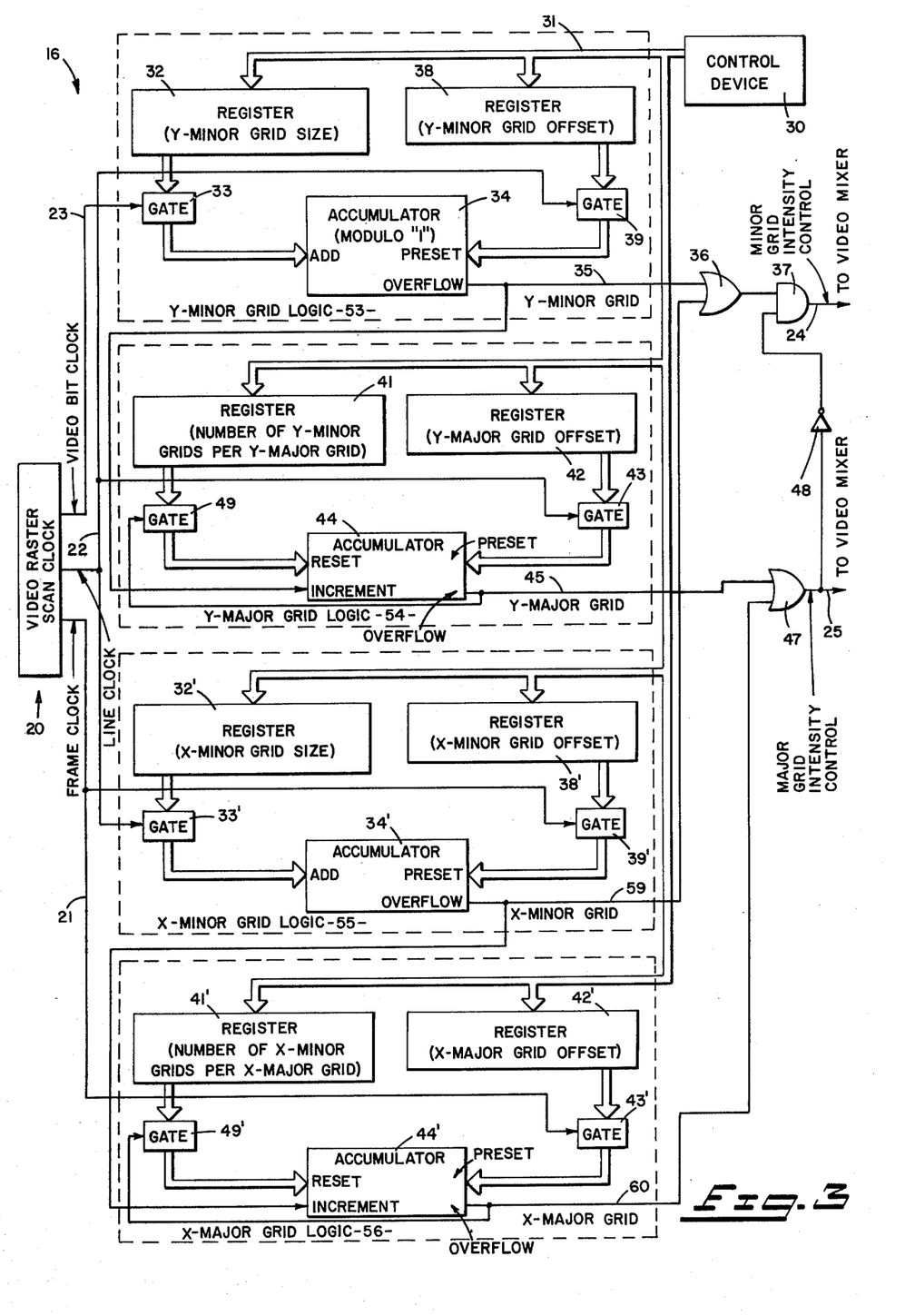
FIG. 3 is an electrical block diagram of a real time implementation of the inventive alignable electronic grid generation system.
Figure 4:
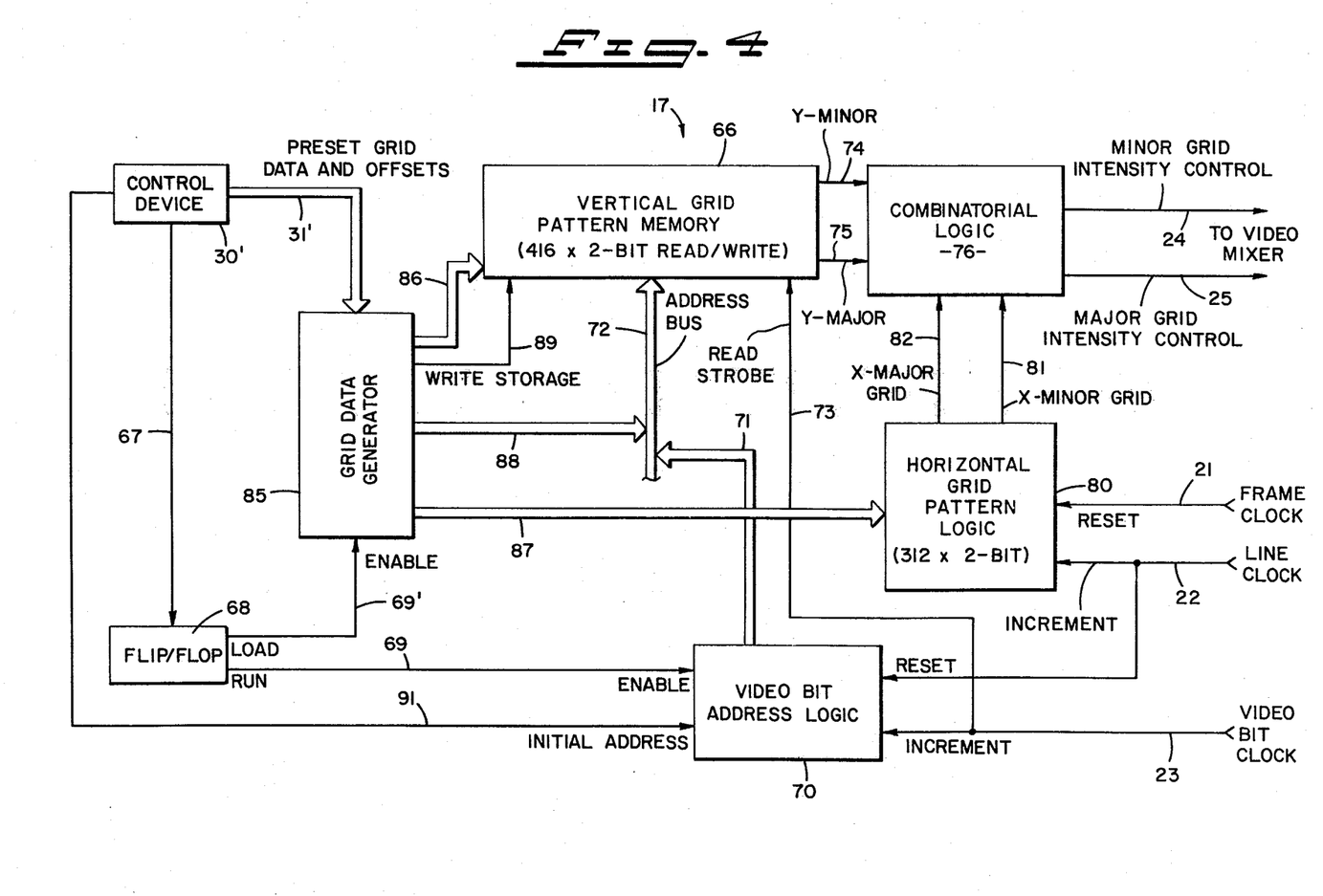
FIG. 4 is an alternative embodiment of the inventive electronic grid generation system, using precomputation of the grid pattern.

The background grid 13 may be generated using either the circuitry 16 of FIG. 3 or the circuitry 17 of FIG. 4. The pictorial data 12 may be produced by any graphics display unit which utilizes conventional raster-type video circuitry to produce the CRT image. By way of example, the picture 12 may be produced by the raster scan display apparatus described in U.S. Pat. No. 4,070,710 to Sukonick et al.

In a raster-type video display, the CRT electron beam is deflected across the screen 11 in sequential rows or lines, typically starting at the top 11T and continuing downward to the bottom of the display. In a typical non-interlaced system there may be 312 such video scan lines.

Each such raster scan line typically begins from the left side 11L of the screen 11 and scans across to the right side. Each such horizontal scan line may be segmented into a plurality of positions, typically 416, each of which constitutes a single pixel of the produced image. At each pixel location the CRT beam may be intensity modulated so as to produce a spot of corresponding intensity. The locii of all such intensified spots constitutes the displayed image.

The present invention utilizes the raster-type video timing signals to synchronize generation of the background grid 13. Thus the circuit 16 (FIG. 3) receives from the video raster scan clock 20 a frame clock pulse (on a line 21) which occurs at the beginning of each video frame, a line clock pulse (on a line 22) which occurs at the beginning of each horizontal scan and a train of video bit clock pulses (on a line 23) which occur at regular intervals as the CRT beam scans through the consecutive pixel locations within each horizontal scan line.

The grid generator 16 produces minor grid and major grid intensity control signals on the respective lines 24 and 25. As the CRT beam scans through each pixel location, a signal is produced on one or the other of the lines 24 and 25 if a segment of the grid 13 is to be produced at that location. If no grid segment is to be present at that pixel, no signal is produced on either line 24 or 25.

To produce the background grid illustrated in FIG. 1A, as the CRT beam scans along the line at which the first horizontal grid line 14a' is to be generated, pulses will be produced on the lines 24 and 25. The first such pulse will occur on the line 24 and will be supplied to the video mixer (not shown, but known per se) in the associated graphics display unit where it will be used to modulate the CRT beam so as to produce a spot 26 (FIG. 1A) of relatively low intensity. At a slightly later time, a pulse will be produced on the line 25 and supplied to the same video mixer. This pulse will cause the CRT beam to produce a spot 27 of somewhat greater intensity. Next, four pulses will occur on the line 24 which will cause production of the spots 28. This procedure will be repeated throughout scanning of the video line so as to generate the top grid line 14a'.

A like procedure will be repeated each time the CRT beam scans along a line at which a horizontal grid line 14a or 14b is to be produced. Production of the background grid 13 results. In the video mixer, the signals 24 and 25 are appropriately combined with the intensity modulation control signals, produced by the graphics display unit, which result in the pictorial image 12. Thus for a particular pixel the video mixer may receive no signal, in which case that area of the screen 11 remains dark, a minor grid intensity control signal on the line 24, in which case a low intensity spot is produced as part of the grid 13, a major grid intensity control pulse on the line 25, in which case a grid spot of relatively greater intensity is produced, or a signal from the graphics display unit directing e.g., production of a still more intense spot on the screen 11 which forms part of the pictorial image 12. Pixel combinations of (1) pictorial with minor grid, (2) pictorial with major grid, and (3) the pictorial data itself in general will all be of different intensities to allow the data to "shine through" the grid.

Using the embodiment 16 of FIG. 3, at the beginning of each video frame, or alternatively, each time the background grid 13 is to be altered, a control device 30 provides on a bus 31 appropriate signals representing the grid data and offset parameters listed above. The control device 30 may be part of the computer which generates the pictorial data 12, or may comprise separate logic circuitry which (a) accepts manually input signals defining the grid parameters, or (b) derives such grid parameters from signals, provided by the associated graphics display unit or its computer source, which specify changes in the location or magnification scale of the displayed pictorial image 12.

In the embodiment of FIG. 3, the y-minor grid size, or number of pixels between each vertical grid line, is established by a binary fraction supplied from the control device 30 to a register 32. As the CRT beam scans through each horizontal pixel location, the corresponding video bit clock pulse on the line 23 enables a gate 33 to supply the stored fraction from the register 32 to an accumulator 34 where it is added to the previous contents thereof. The accumulator 34 advantageously is of modulo "1", so that each time the contents reach the value "1" an overflow pulse is generated on an output line 35. This pulse is supplied via an OR-gate 36 and an enabled AND-gate 37 to the minor grid intensity control line 24.

To illustrate this operation, suppose that the vertical grid lines are to be eight raster units or pixels apart. In this instance, the y-minor grid size fraction supplied to the register 32 will be "1/8". This may be represented as a 12-bit binary fraction having the value .0010 0000 0000. At each video bit clock pulse time, this value will be added to the prior contents of the accumuator 34 which will thus reach the value "1" after the CRT beam has scanned through eight pixel locations. As a result, a y-minor grid pulse will occur on line 35 after each eight pixel locations, exactly as required.

The y-minor grid offset value is supplied via the bus 31 to a register 38, advantageously in the form of a binary fraction. As the scanning of each horizontal line begins, the line clock pulse on the line 22 enables a gate 39 to provide this offset value to the "preset" input of the accumulator 34, thereby presetting the accumulator to the offset value. As a result of this operation, the initial vertical grid line 26 (FIG. 1A) will be generated at the desired distance from the display edge 11L.

By way of example, if eight pixels are to separate each vertical grid line, and the first vertical grid line is to appear three pixel units from the screen edge 11L, the grid size is "1/8" and the offset supplied to the register 38 will be "(8−3)/8=5/8" which is represented by the 12-bit binary fraction .1010 0000 0000. Thus at the start of each video line, the accumulator 34 will be preset to the binary value "5/8", and at each succeeding video bit clock time the binary value "1/8" will be added to the accumulator 34. Thus the accumulator 34 will first reach value "1" after 3 video bit clock pulses have occurred. As a result, the first y-minor grid pulse will occur on the line 35 when the CRT beam is in the third pixel position. As a result, the first vertical grid line 26 will be produced at the desired offset position. Thereafter, the accumulator 34 will reach the value "1" and will overflow each eighth video bit clock time. As a result, y-minor grid pulses will occur on the line 35 corresponding to pixel positions 3, 11, 19, 27 and every eighth pixel thereafter, thus producing the desired grid spacing and offset.

The grid line spacing size need not be of integer value. In general, if the grid lines are to be space n unit apart, the grid size fraction supplied to the register 32 will be the binary equivalent of "1/n". This arrangement is satisfactory for any value of n>1. If n is not an integer (for instance 8.24 pixel units spacing), each vertical grid line will appear on the nearest whole vertical pixel column, never more than one-half pixel from its true position. The fractional distance is accurately accumulated by the accumulator 34, since after the value "1" is reached and the overflow output pulse produced, the accumulator 34 will contain the value of the overflow fraction (i.e., the amount in excess of "1" which results from the prior addition).

The first vertical grid line 26 may appear at any integer pixel column less than n from the left screen edge 11L. To offset the first grid line to a pixel position $r<n$, the binary equivalent of the fraction "$(n-r)/n$" is used as the grid offset value supplied to the register 38.

To produce the vertical grid lines 15b of greater intensity, a value corresponding to the number of vertical grid lines of lesser intensity for each vertical line of greater intensity is supplied from the control device 30 to a register 41 (FIG. 3). Similarly, an offset value representing the number of minor grid lines between the vertical display edge 11L and the first major intensity vertical grid line is supplied via the bus 31 to a register 42. Advantageously, but not necessarily, the registers 41 and 42 are 4-bit registers and store the respective values in two's compliment form. For example, as illustrated in FIG. 1A, if there are 4 (binary 0100) minor grid lines 15a between each major grid line 15b, and the first major grid line 27 is offset from the left edge 11L by one (binary 0001) minor grid line 26, the registers 41 and 42 respectively may store the two's complement values 1011 and 1110.

At the beginning of each horizontal scan line, the line clock pulse on the line 22 enables a gate 43 to preset an accumulator 44 to the offset value stored in the register 42. Advantageously, the accumulator 44 is a 4-bit device of modulo binary 1111, which produces an overflow pulse on a line 45 when the accumulated sum exceeds that maximum value.

Figure 1B:
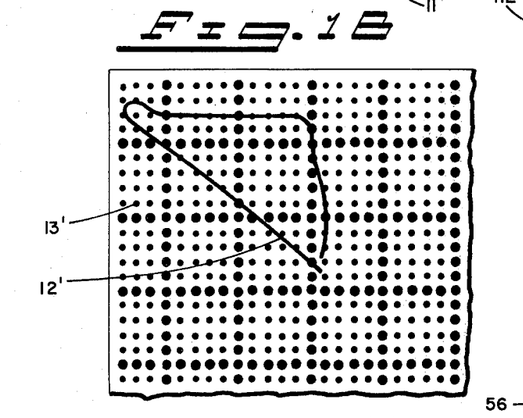

Each y-minor grid pulse which occurs on the line 35 causes the accumulator 44 contents to increment by the binary value 0001. Thus if the accumulator 44 initially is preset to the value 1110 (corresponding to an offset of one minor grid line), occurrence of the first pulse on the line 35 (which results in generation of a spot in the first minor vertical grid line 26) causes the contents of the accumulator 44 to reach 1111. When the next y-minor grid pulse occurs on the line 35, the accumulator 44 exceeds its maximum value and produces an overflow pulse on the y-major grid line 45. This pulse is fed via an OR-gate 47 to the major grid intensity control line 25. As a result, a spot of greater intensity is produced in the location corresponding to the first major vertical grid line 27 (FIG. 1). The pulse on the line 25 also is inverted by an inverter 48, the resultant low output of which disables the AND-gate 37. As a result, the concurrently produced pulse on the line 35 does not reach the line 24, so that the video mixer in the associated graphics display unit only receives the requisite major grid intensity control pulse from the line 25.

The pulse on the line 45 also enables a gate 49 to provide the value from the register 41 to the reset input of the accumulator 44. Thus in the example where there are four minor grid lines 15a for each major grid line 15b, the accumulator 44 will be reset to the two's complement value 1011.

Thereafter, each occurrence of a y-minor grid pulse on the line 35 will increment the accumulator 44 by 0001. After four such pulses the contents of the accumulator 44 will reach 1111. During this time, the minor intensity spots for the vertical lines 28 (FIG. 1A) will be generated. Upon occurrence of the fifth such pulse on the line 35 the accumulator 44 again will overflow and produce another pulse on the line 45. This will result in production of the major grid intensity control signal on the line 25 to produce the next higher intensity spot in the vertical grid line 15b. Again, this pulse will open the gate 49 to reset the accumulator 44 to the value previously stored in the register 41. This operation is repeated throughout the complete horizontal scan so as to produce the requisite y-major grid pulses. Although the "preset" and "reset" inputs to the accumulator 44 are shown as separate inputs in FIG. 3, these can actually be the same reset input.

The use of 4-bit binary circuitry for the registers 41, 42 and the accumulator 44 is exemplary only. Four bits permit implementation of major vertical grid lines for every two, every five or every ten minor intensity grid lines, thereby matching the commonly used grid paper scales. However, larger or smaller size registers and accumulators may be employed.

As described above, the y-minor grid logic 53 (consisting of the components 32–34, 38 and 39) and the y-major grid logic 54 (consisting of the components 41–44 and 49) cooperate to produce the requisite intensity control signals for generating the vertical grid line components during a single horizontal scan (e.g. along the row 56 of FIG. 2B) of the CRT beam which does not coincide with a horizontal grid line. Another set x-minor grid logic 55 (FIG. 3) and x-major grid logic 56 further cooperate to produce the minor horizontal grid lines 14a and the intensified major horizontal grid lines 14b. This is illustrated in FIG. 2B where the small "x" symbols represent pixel locations at which no background grid spot is present. In this example, the top horizontal CRT scan line 56 contains background grid spots related only to vertical grid lines. The first horizontal grid line 14a'' occurs along the second CRT scan line, corresponding to a x-minor grid offset of one. This value is supplied by the control device 30 to the register 38' in the x-minor grid logic 55. As also illustrated in FIG. 2B, there are two video raster scan lines 58 between adjacent horizontal grid lines 14a or 14b. A value corresponding to this x-minor grid size is supplied by the control device 30 to the register 32'.

Advantageously, the registers 32' and 38', as well as the other components 33', 34' and 39' of the grid logic 55 correspond in type and operation to the unprimed but like numbered components in the grid logic 53. Thus the register 32' advantageously receives a binary number corresponding to the fraction "$1/m$" where m corresponds to the number of video raster scan lines separating adjacent horizontal grid lines. Similarly, the register 38' receives a binary number corresponding to the fraction "$(m-p)/m$" where p is the offset of the first horizontal grid line. The gates 33' and 29' respectively are enabled by the line clock pulses on the line 22 and the frame clock pulses on the line 21.

With this arrangement, the accumulator 34' (which advantageously is of modulo "1") will produce an overflow pulse on the x-minor grid line 59 for the entire duration of each CRT horizontal scan for which a minor intensity horizontal grid line 14a is to be produced. The signal on the line 59 is supplied via the OR-gate 36 and the enabled AND-gate 37 to the minor grid intensity control line 24, and results in production of a horizontal grid line 14a. During CRT beam scanning of a row 56 or 58 which does not coincide with a horizontal grid line, the signal on the line 59 will be low. As a result, the only pulses which will reach the lines 24 and 25 are those generated by the y-minor and y-major grid logic 53 and 54 and associated with vertical grid lines.

The x-major grid logic 56 is used to generate each major intensity horizontal grid line 14b. To this end, the x-major grid logic 56 utilizes a register 41' that receives from the control device 30 a signal indicative of the number of horizontal lesser-intensity grid lines 14a between each major intensity horizontal grid line 14b. Similarly, the register 42' receives an offset value indicating the number of lesser intensity horizontal grid lines between the top 11T of the display 11 and the uppermost major horizontal grid line 14b. The registers 41' and 42', and the other components 43', 44' and 49' of the grid logic 56 advantageously are configured like the corresponding unprimed, but like numbered components of the grid logic 54. Thus the registers 41' and 42' may store the corresponding data in two's complement form. The gate 43' is enabled by the video frame clock pulses on the line 21, and the accumulator 44' is incremented by the pulses from the x-minor grid line 59.

With this arrangement, the accumulator 44' will overflow and provide a x-major grid pulse on a line 60 throughout the duration of each CRT horizontal scan line in which a grid line 14b of major intensity is to be produced. The high signal on the line 60 is fed via the OR-gate 47 to the major grid intensity control line 25. As a result, the relatively greater intensity horizontal grid line 14b will be produced on the screen 11. The signal on the line 25 will be inverted by the inverter 48 and will disable the AND-gate 37. Thus no minor grid intensity control signals will be produced on the line 24 during production of a major horizontal grid line.

The circuitry 16 of FIG. 3 thus is capable of generating a background grid 13 in which various grid parameters (listed in the SUMMARY OF THE INVENTION section hereinabove) can be varied to any selected value. This enables the circuitry 16 readily to adjust the background grid 13 to maintain alignment with the displayed pictorial image 12 during pan (FIG. 1B) or zoom (FIG. 1C) operation. For example, if the pictorial image 12 (FIG. 1A) is panned to the position 12' of FIG. 1B, the background grid can be maintained in alignment with the pictorial image by appropriately changing the grid offset values supplied to the registers 38, 38', 42 and 42' without changing the grid size and minor/major grid ratios supplied to the registers 32, 32', 41 and 41'. Such appropriate change in the grid offset values will produce the background grid 13' shown in FIG. 1B, which retains the same alignment with the pictorial image 12' as was present in the original display of FIG. 1A.

Figure 1C:
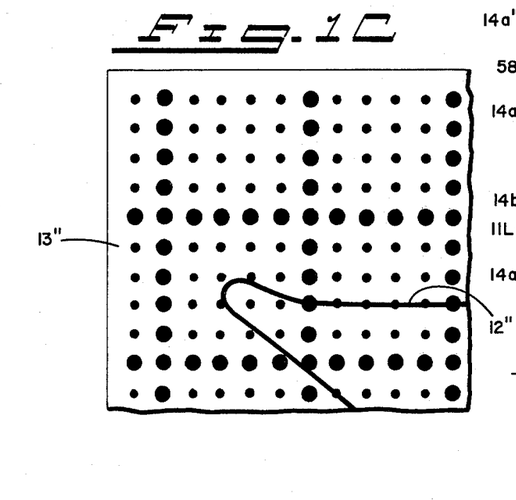

During zoom operation, the y-minor and x-minor grid size values supplied to the registers 32 and 32' are appropriately altered to conform to the zoom factor (i.e., "magnification") of the pictorial image 12". The minor/major grid ratios supplied to the registers 41 and 41' may remain unchanged, and the grid offset values may remain the same or be changed to keep the picture aligned. The minor grid size supplied to the registers 32 and 32' would become a smaller fraction, meaning more pixels per minor grid line. For example, if FIG. 1C were a 2X magnification of FIG. 1B, then registers 32 and 32' would contain exactly one-half their values for generating the pattern of FIG. 1C as compared to generating the pattern of FIG. 1B. With such changes a "magnified" background 13" is produced which has the same zoom factor as the enlarged pictorial image 12" (FIG. 1C).

Figure 2A:
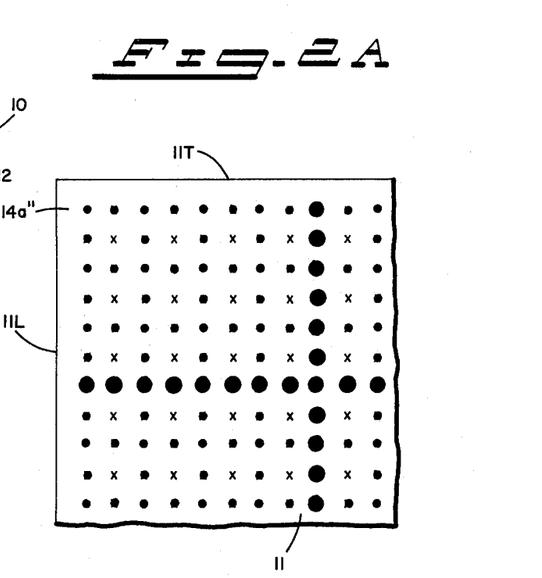
FIGS. 2A and 2B are enlarged fragmentary views of background grids produced by the inventive system for two different sets of grid parameters.
Figure 2B:
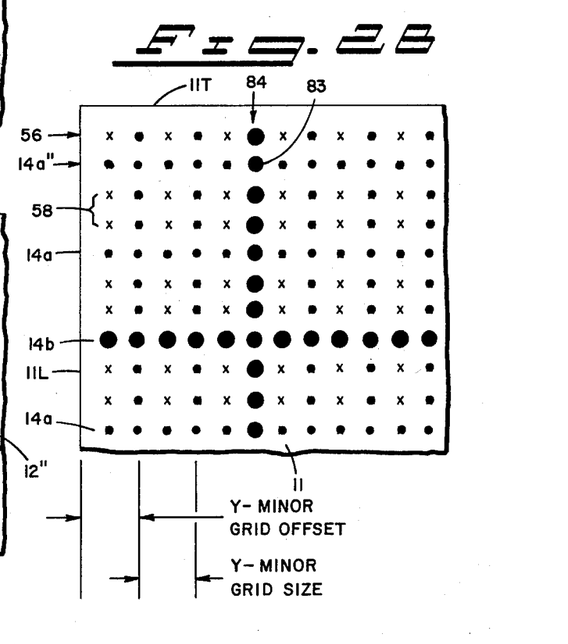

The selectable control of all background grid parameters is further illustrated in FIG. 2A and 2B. For example, in FIG. 2A the first horizontal grid line 14a" is produced along the uppermost CRT horizontal scan line. This corresponds to a x-minor grid offset of zero.

By contrast, in FIG. 2B (discussed above) the x-minor offset is one. Other grid parameter changes are apparent by comparison of FIG. 2A and 2B.

The grid generation circuitry of FIG. 3 operates in real time. Thus in a typical system, the video bit clock rate may be 10 MHz, and the clock rate may be 20 kHz. These high pulse rates require the circuitry 16 to be operable at commensurate rates. For example, the accumulator 34 would operate at 10 MHz. Although such operation is possible with existing integrated circuitry, the alternative grid generation system 17 of FIG. 4 offers the advantage that computation at the video bit clock rate is not required. Lower cost is possible.

In the circuit 17, an addressable memory 66 stores the entire vertical grid pattern, and is read out during each horizontal sweep of the display CRT. For example, if there are 416 pixels in each video raster line, the memory 66 may have 416 storage locations, each of which is capable of storing a 2-bit binary signal. If this signal is "00", no vertical grid spot is to be produced at the corresponding horizontal pixel location. A code of "01" may specifiy a vertical grid spot of minor intensity ("y-minor"), while a code of "10" may specifiy a vertical grid spot of major intensity ("y-major"). Optionally, a code of "11" may function as a horizontal or x-inhibit which blanks or inhibits the generation of either a minor or major intensity grid spot which is concurrently specified for a horizontal grid line.

During grid generation, the control device 30' (corresponding to the control device 30 of FIG. 3) produces a signal on a line 67 which sets a flip-flop 68 to produce a high "run" signal on a line 69. This signal enables appropriate address control logic 70 to produce on a bus 71 consecutive addresses corresponding to sequential horizontal pixel locations on a single video scan line. In the example given, these addresses may consist of the numbers "1" through "416" corresponding to like identified storage locations in the memory 66. Advantageously, the address logic 70 comprises a counter which is reset to zero by each line clock pulse on the line 22, and which is incremented by "1" upon occurrence of each video bit clock pulse on the line 23.

The address on the bus 71 is supplied to the address bus 72 of the memory 66, while simultaneously the video bit clock is supplied to the memory 66 via a line 73 as a "read strobe" pulse. As a result, the 2-bit signal stored by the memory 66 at the addressed location is provided to the lines 74 and 75 (corresponding respectively to the lower order and higher order bit positions of the stored signal). If a minor intensity vertical grid line ("y-minor") is to be produced, appropriate combinatorial logic 76 will be enabled so that a high signal on the line 74 will cause a high signal to be supplied to the minor grid intensity control line 24. Similarly a high ("y-major") signal on the line 75 will cause output of a high signal on the major grid intensity control line 25. These conditions prevail during CRT scanning of a row which does not coincide with a horizontal grid line, and for which no vertical or y-inhibit is in effect.

Appropriate logic 80 advantageously stores or generates a desired horizontal grid pattern. In the example used above, in which there are 312 horizontal CRT scan lines in the display 11, the logic 80 may comprise 312 storage locations each containing a 2-bit signal indicating whether no horizontal grid line (signal=00), a minor horizontal ("x-minor") grid line (01) or a major horizontal ("x-major") grid line (10) is to be produced along the corresponding video scan line. Optionally, the signal "11" may function as a vertical or y-inhibit which blanks or inhibits the generation of either a minor or major intensity grid spot which is concurrently specified for a vertical grid line.

The logic 80 may be implemented by using a 2-bit wide recirculating shift register which is shifted upon each occurrence of the line clock pulse on the line 22. Alternatively, the logic 80 may comprise an addressable memory and appropriate address logic which is incremented by the line clock pulses from the line 22 and reset by the frame clock signals from the line 21. Such embodiment is analogous to the memory 66 and address logic 70 used for vertical grid pattern generation. In yet another alternative, the logic 80 may not utilize any memory, but may comprise a microprocessor or dedicated computational logic which performs an approximate algorithm to compute the desired horizontal pattern in real time.

In the event that the logic 80 indicates that a minor horizontal grid line is to be produced (and no horizontal inhibit is in effect) a high signal will occur on a line 81 which causes the combinatorial logic 76 to produce an appropriate output on the minor grid intensity control line 24. If a horizontal grid line 14b of major intensity is to be produced, the line 81 will be low and a high signal will be produced on a line 82. As a result, the combinatorial logic 76 wil produce a major grid intensity control signal on the line 25 for the entire horizontal sweep of the CRT.

Advantageously, the combinatorial logic 76 implements the truth table set forth in Table I below. Such arrangement performs the operations just described. For example, during the CRT horizontal sweep corresponding to generation of the x-minor grid line 14a" (FIG. 2B), the x-minor and x-major lines 81 and 82 respectively will have the signals "1" and "0". Therefore, a minor grid intensity control signal will be produced on the line 24, except when the y-major line 75 goes high (i.e., is a "1"). Then, a major grid intensity control signal will occur on the line 25, resulting in production of the major intensity pixel 83 (FIG. 2B) associated with the y-major grid line 84.

TABLE I

| Y-Minor (Line 74) | Y-Major (line 75) | X-Minor (Line 81) | X-Major (Line 82) | Grid Intensity (Lines 24, 25) | Inhibit |
|---|---|---|---|---|---|
| 1 | 1 | 1 | 1 | Off | Inhibit X and Y |
| 0 | 1 | 1 | 1 | Off | Inhibit Y |
| 1 | 0 | 1 | 1 | Off | Inhibit Y |
| 0 | 0 | 1 | 1 | Off | Inhibit Y |
| 1 | 1 | 0 | 1 | Off | Inhibit X |
| 0 | 1 | 0 | 1 | Major | |
| 1 | 0 | 0 | 1 | Major | |
| 0 | 0 | 0 | 1 | Major | |
| 1 | 1 | 1 | 0 | Off | Inhibit X |
| 0 | 1 | 1 | 0 | Major | |
| 1 | 0 | 1 | 0 | Minor | |
| 0 | 0 | 1 | 0 | Minor | |
| 1 | 1 | 0 | 0 | Off | Inhibit X |
| 0 | 1 | 0 | 0 | Major | |
| 1 | 0 | 0 | 0 | Minor | |
| 0 | 0 | 0 | 0 | Off | |

Minor = Line 24 high.
Major = Line 25 high.
Off = Lines 24 and 25 both low.

Figure 5:
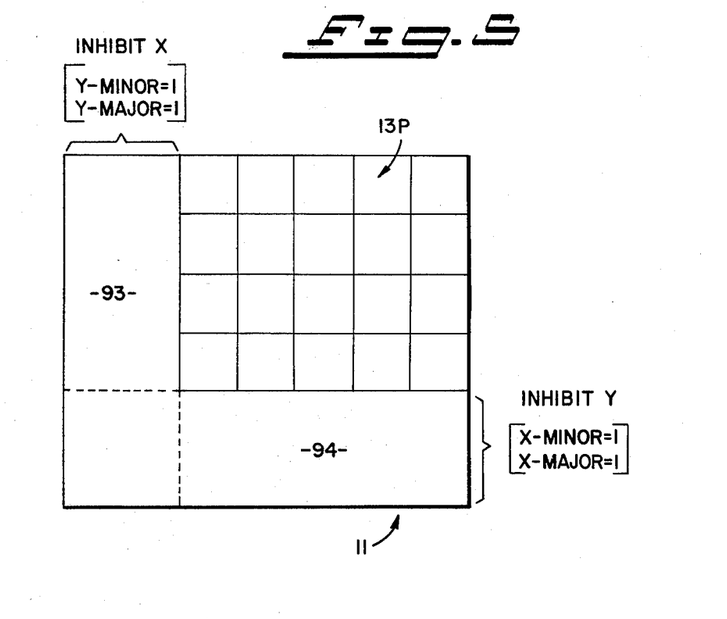
FIGS. 5 and 6 illustrate alternative grid displays which can be implemented using the inventive system.

Use of the inhibit function to blank or eliminate the background grid in selected areas of the CRT display screen 11 is illustrated in FIG. 5. Here the display includes a background grid 13P which covers only a portion of the screen. No background grid is present in a vertical region 93, nor is any grid present in a horizontal region 94. This effect is achieved using the combinatorial logic 76 in accordance with Table I.

If the vertical strip 93 is to appear at the left side of the screen 11, and have a width of say 100 pixels, then the first 100 storage positions in the vertical grid pattern memory 66 each will contain the code "11". As indicated by Table I, as the CRT horizontally scans past the first one hundred pixel locations, the code "11" will be read from the memory 66. Both grid intensity control lines 24 and 25 will produce a low output. As a result, no background grid will appear in this region 93. For the remainder of each horizontal CRT scan (above the region 94), the regular grid pattern information will be read from the memory 66, resulting in production of the background grid 13P.

As the CRT scans across the horizontal rows in the region 94, the horizontal grid pattern logic 80 will produce high signals on both the lines 81 and 82. As a result (Table I), the combinatorial logic 76 will ensure that both the grid intensity control lines 24 and 25 are low. Hence, no background grid will be produced in the region 94. The use of grid-free background regions in the display 11 is useful for various applications, such as where alpha-numeric "menus" are generated by the graphics display control computer for presentation in the regions 93 and 94 where there is no background grid.

Figure 6:
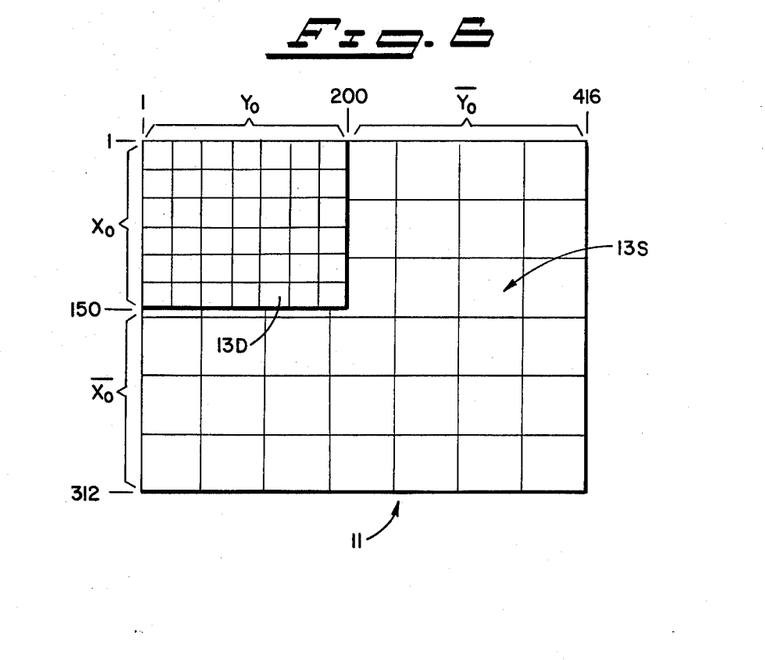

Displays in which there are background grids of different grid size in different regions of the screen 11 also can be produced in accordance with the present invention, using circuitry like that shown in FIG. 4. For example, the dual size grid display of FIG. 6 can be produced by the circuitry of FIG. 4 utilizing a 3-bit wide memory 66 (including bits $Y_0$, $Y_1$ and $Y_2$) and a 3-bit wide logic 80 (including bits $X_0$, $X_1$ and $X_2$). In the display of FIG. 6, the upper left hand portion has a relatively dense background grid 13D and the remainder of the screen has a relatively sparse background grid 13S with wider vertical and horizontal spacing. In this illustrative display, all of the grid lines are of equal intensity.

To implement the display of FIG. 6, the $X_0$ and $Y_0$ bits are used to specify the different display areas. For example, if the dense grid area 13D extends from the top horizontal scan line down through the 150th horizontal scan line, for the first 150 storage positions of the logic 80, the value of $X_0$ will be "1". For the remainding storage locations 151 through 312, the value of $X_0$ will be "0". Similarly, the $Y_0$ bits stored in the vertical grid pattern memory 66 will have the value "1" for the first 200 locations (corresponding to the width of the dense region 13D), while the remaining $Y_0$ storage locations 201 through 416 in the memory 66 will contain the value $Y_0=0$.

The $Y_1$ and $Y_2$ bits stored in the memory 66 will contain respectively the vertical grid patterns for the upper and lower portions of the FIG. 6 display. Thus, the first 200 $Y_1$ bits will correspond to the vertical grid pattern of the dense region 13D, while the remaining 216 stored values for $Y_1$ will correspond to the vertical grid pattern of the sparse region 13S. All 416 stored values of the $Y_2$ bit in the memory 66 will correspond to the sparse grid pattern 13S. Similarly, in the logic 80, the stored values for the bit $X_1$ will correspond to the horizontal grid spacing of the dense grid 13D for the first 150 locations, and will correspond to the horizontal spacing of the sparse grid 13S for the remaining locations 151 through 312. All 312 stored values for $X_2$ will correspond to the latter sparse grid 13S.

With this arrangement, the combinatorial logic 76 will produce a "grid ON" signal (for example, corresponding to the major grid intensity control signal on the line 25) when the following condition is met:

Grid ON = ($X_0$ and $Y_1$) or ($\overline{X_0}$ and $Y_2$) or ($Y_0$ and $X_1$) or ($\overline{Y_0}$ and $X_2$)

where $X_0$ and $X_0 = 1$ and $\overline{X_0}$ means $X_0 = 0$, with the same interpretation for $Y_0$ and $\overline{Y_0}$. $X_1$, $X_2$, $Y_1$ and $Y_2$ each can have the value "1" indicating that a corresponding grid ON signal is to be produced, or a value "0" indicating that no grid sport is to be produced. This arrangement will produce the two-density grid display of FIG. 6.

The same concept can be expanded to multiple different grid regions, or to multiple grid line intensities, or to incorporate the inhibit feature illustrated in FIG. 5, all by providing sufficient additional bits in the vertical and horizontal grid pattern memory 66 and logic 80.

In this regard, although the above description has been set forth in terms of two grid intensities (major and minor), the invention is not so limited. For example, multiple data bits can be used to define various gray scale densities for each grid spot, or to indicate different colors for different horizontal and vertical lines or different grid spots. In addition, the ON-OFF duty cycle of individual grid lines or grid spots may be modulated to produce a background grid of varied intensity or color.

The contents of the memory 66 and logic 80 need be altered only when the background grid pattern is changed. When this occurs, the control device 30' will modify the signal on the line 67 so as to reset the flip-flop 68 to a condition in which the "run" signal on the line 69 in terminated and a "load" signal is produced on a line 69'. This signal enables a grid-data generator 85 to accept the preset grid data and offset parameter values from the bus 31' (corresponding to the bus 31 of FIG. 3). The circuit 85 converts the supplied parameter values to appropriate corresponding sets of vertical and horizontal grid pattern information, and enters these via a pair of buses 86, 87 into the memory 66 and logic 80. During such data entry, the circuit 85 may provide appropriate memory addresses to the memory 66 via a bus 88, and may provide corresponding "write strobe" signals via a line 89. Corresponding addresses and signals may also be provided to the logic 80.

Although not so limited, the grid data generator 85 itself may comprise circuitry similar to that of FIG. 3. In such instance, the signals produced on the line 35 and 45 may be supplied as inputs (via the bus 86) to the vertical grid pattern memory 66, while the signals on the line 59 and 60 provide inputs to the horizontal grid pattern logic 80 via the bus 87. Whereas the circuitry of FIG. 3 operated in real time when used directly to drive the graphics display unit, it can operate at a slower rate to provide the memory 66 and logic 80 inputs, since the calculations need only be performed once, at the time that the background grid parameters are changed and the new data is loaded into the circuits 66 and 80. When used for this purpose, the circuitry 16 need not be driven by the video raster scan clock signals, but could be driven by separate clock signals supplied internally or from the control device 30'.

As an alternative, the grid data generator 85 may be dispensed with entirely, and the control device 30' or the source computer which produces the pictorial image display information 12 itself may be used to generate the background grid vertical and horizontal patterns, which then may be loaded directly into the memory 66 and the logic 80.

The latter arrangement also is useful for the generation of background grids in which the horizontal and/or vertical line spacing is an arbitrary function. For example, the computer may utilize conventional mathematical techniques to generate line spacings of logarithmic or other function. If the vertical grid lines are to be spaced logarithmically, for example, and the horizontal lines are to be equally spaced, the control device 30' would direct entry into the memory 66 of a vertical grid pattern of spots spaced logarithmically. The horizontal grid pattern logic 80 would be provided with data directing horizontal grid line generation at regular vertical intervals.

During a panning operation it is possible that the pictorial image 12 (FIG. 1A) is moved gradually across the screen 11 so as to assume a slightly different position during each successive video frame. Using the circuitry 17 described above, concurrent aligned movement of the background grid could be obtained by totally regenerating the entire contents of the vertical and horizontal grid pattern memory 66 and logic 80 at each new frame. However, this would require very high speed operation, and is in fact not necessary. Rather, the addressing of the memory 66 and logic 80 may be modified slightly to accommodate such panning.

Thus panning along the horizontal axis can be accommodated merely by modifying the initial address at which the vertical grid pattern memory 66 is accessed during each video scan line, with "wrap around" read-out of the memory 66 after the final address has been reached. To this end, the control device 30' may provide during successive video frames different initial addresses to the logic 70 via a line 91. Thus, for example, if the image 12 is moved toward the left (FIG. 1A) by one pixel unit at each frame, the control device 30' may direct the address logic 70 to begin accessing of the memory 66 at consecutive initial addresses 2, 3, 4, ... upon occurrence of successive video frames. In each instance, during each horizontal CRT line scan, when the end (address 416) of the memory 66 is reached, the logic 70 would then address the beginning of the memory (positions 1, 2 ... ) to the extent necessary to complete generation of the requisite grid pattern. If the grid pattern data stored in these initial locations does not coincide with, or follow in a regular order, the grid pattern data stored in the high order (location 416) end of the memory 66, the control device 30' or the grid data generator 85 may be used appropriately to alter one word of grid data in the low order of positions of the memory 66 at each frame time. By enlarging the memory 66 to have e.g., 512 storage locations, the data bits to be modified for each frame would always be outside the 416 address region that would be used to generate the currently viewed grid, hence reducing memory conflict. For example, during consecutive frames of a horizontal panning operation, the logic 70 may address memory 66 locations 10 through 425, 11 through 426, 12 through 427, ... , 97 through 512.

Meanwhile the control device 30' or the grid data generator 85 may be modifying the initial low order positions 1 through 96 so that when the high order end of the memory 66 is reached and a wrap around operation begins, the lower order locations will store correct vertical grid pattern information to continue generation of the desired background grid without interruption.

Vertical panning may be accomplished in the same manner by stepped read-out of the horizontal grid pattern logic 80, starting at consecutive initial locations at the beginning of successive video frames. As discussed in conjunction with the memory 66, read-out of the logic 80 then may be of a "wrap around" nature, or the size of this logic 80, if implemented by a memory, may be enlarged to accommodate such panning. If the logic 80 is implemented by computation circuitry, approximate provision may be made in the algorithm to modify the computed pattern values as panning takes place.

As described above, read-out of the memory 66 is synchronized with the horizontal scan of the CRT beam. However, read-out of the memory 66 may be at a slower rate employing a random access memory of more than 2-bit width. For example, the memory 66 may be 8 or 16 bits wide, so that each storage location contains the grid pattern data for four or eight consecutive pixel locations. In that case, the access time for each memory 66 location can be respectively one-fourth or one-eighth of the read time required for an implementation in which consecutive storage locations are read out in exact synchronism with the horizontal video scan. A parallel-to-serial converter then can be used to convert the grid pattern data, read in parallel from the memory 66, into serial form in synchronism with the horizontal video scan. This technique allows a slower, less expensive memory device to be used as the memory 66.

The memory 66 need not be of the random access type. Alternatively, a serial shift register memory or a FIFO memory wrapped around to form a shift register may be employed. Similarly, the logic 80 may be implemented using any of these mechanisms. As noted above, the system is not limited to two background grid intensities. Multiple intensities could be employed. For example, with 2-bit wide memories 66 and logic 80, three grid intensities (represented by codes 01, 10 and 11) could be achieved, together with the grid-off code 00, without the inhibit feature. By making the memories 66 and logic 80 more than two bits wide, additional grid intensity commands can be stored. For example, a 3-bit wide memory could command seven intensities, or seven colors, plus the grid-off condition, without inhibit.

It is not necessary to use the video bit clock as the source for address generation for the vertical grid pattern memory 66. The video bit clock may be replaced by a slower or faster horizontal grid clock signal supplied to the line 23. However, it is necessary that this horizontal grid clock be initiated at the start of each video line (i.e., in synchronism with the line clock on the line 22), and that it complete a cycle during the scan of a single video line.

Sequential logic (i.e., flip-flops or programmable logic array feedback lines) may be utilized in the combinatorial logic 76. Such use may reduce the storage or logic requirements of the memory 66 or logic 80, for example by recognizing otherwise unused code combinations instead of the $X_0$ and $Y_0$ bits.

In an alternative embodiment for the circuitry 16 of FIG. 3, the logic systems 53 and 55 could utilize an arrangement similar to that of the logic circuits 54 and 56, wherein the grid size and grid offset registers store the two's complement of the desired parameter values, and the accumulators 34 and 34' are incremented respectively upon occurrence of the video bit clock and line clock pulses. This has the advantage of less complexity than the logic systems 53 and 55, but with the disadvantage of not permitting minor grid sizes to be fractional pixels.

I claim:

1. An alignable electronic background grid generation system for use with a raster-type video graphics display unit on which graphic data is displayed, comprising:

control means for supplying alterable grid pattern and offset data, vertical grid pattern generation means, cooperating with said control means and synchronized with the display unit horizontal video scan, for providing in response to said alterable grid pattern data vertical grid pattern defining signals indicative of requisite background grid spots at horizontal picture element locations corresponding to desired vertical background grid lines specified by said grid pattern data, horizontal grid pattern generation means, cooperating with said control means and synchronized with the display unit vertical line scan, for providing in response to said alterable grid pattern data horizontal grid pattern defining signals indicative of a desired horizontal grid line pattern specified by said grid pattern data, and combinatorial logic means, cooperating with both said vertical and horizontal grid pattern generation means, for combining said provided vertical and horizontal grid pattern defining signals and producing as a result of said combination a set of grid intensity or color control signals, said grid intensity control signals being supplied to said video gaphics display unit to be mixed with the other video signals defining said graphic data being displayed, said display unit thereby producing a composite display including both said graphic data and said background grid.

2. A system according to claim 1 wherein said graphics display unit has a pan capability, and wherein said control means comprises:

grid offset circuitry for providing to said vertical and horizontal grid pattern generation means respective vertical and horizontal grid offset data indicating the number of horizontal picture element locations and the number of complete video scan lines to be skipped before generation respectively of the first vertical and horizontal grid lines in said background grid, and offset modification means for modifying the operation of said vertical and horizontal grid pattern generation means in accordance with the extent of panning of said graphics display unit, so that the generated background grid moves in synchronism with said displayed graphic data.

3. A system according to claim 2 wherein said displayed graphic data is generated from a memory storing such data, said panning being accomplished by changing the memory initial storage address from which said graphic data is accessed, and wherein said offset modification means modifies said provided grid offset data in response to changes in said graphic data memory initial storage address.

4. A system according to claim 1 wherein said graphics display unit has a zoom capability, and wherein said control means comprises:
grid size circuitry for providing horizontal and vertical grid size data specifying the number of picture element locations between adjacent vertical grid lines and specifying the number of horizontal video scan lines between adjacent horizontal grid lines, and
zoom circuitry means, cooperating with said grid size circuitry, for modifying said provided grid size data in response to changes in the zoom magnification factor of said graphics display unit so that the generated grid will be effectively magnified in scale in unison with the displayed zoomed graphic data.

5. A system according to claim 1 wherein said vertical grid pattern generation means comprises:
minor grid logic including a first register for storing a fraction indicative of minor grid size, and
an accumulator for repetitively accumulating the minor grid size indicating fraction from said first register at each horizontal video bit clock pulse time, the overflow of said accumulator providing said grid intensity control signals.

6. A system according to claim 5 wherein said minor grid logic also comprises:
another register for storing a minor grid offset value, and
means for presetting said accumulator to the offset value stored in said other register at the beginning of each horizontal video scan of said graphics display unit.

7. A system according to claim 5 wherein said background grid includes grid lines of at least two different intensities, and wherein said vertical grid pattern generation means further comprises:
major grid logic including a second register for storing a value indicative of the number of vertical grid lines of one intensity per each vertical grid line of a different intensity, and
a second accumulator for effectively counting the number of grid intensity control signals produced by said minor grid logic and for producing a different grid intensity control signal when said count corresponds to the value stored in said second register, said grid intensity control signals from said minor and major grid logic respectively causing said graphics display unit to produce background grid spots of mutually different intensity.

8. A system according to claim 7 wherein said major grid logic further comprises:
offset register means for providing a grid offset value indicative of how many vertical grid lines of intensity established by said minor grid logic are to be produced before production of the first vertical grid line of intensity established by said major grid logic, and
means for presetting said second accumulator to the offset value from said offset register means at the beginning of each horizontal video scan.

9. A system according to claim 7 wherein each horizontal grid pattern generation means comprises:
separate minor grid logic circuitry including a third register for storing a fraction indicative of the number of horizontal video scan lines between adjacent horizontal grid lines, and
a third accumulator for repetitively accumulating the fraction from said third register at the completion of each horizontal video scan, the overflow of said third accumulator providing a signal for enabling a grid intensity control signal to be supplied to said video graphics display unit throughout the entire next horizontal video scan.

10. A system according to claim 9 wherein said separate grid logic circuitry also comprises:
a fourth register for storing a minor grid offset value indicating the number of horizontal video scan lines which are to occur before generation of the first horizontal grid line for each video frame, and
means for presetting said third accumulator to the offset value from said fourth register at the beginning of each video frame of said graphics display unit.

11. A system according to claim 9 wherein said background grid includes grid lines of at least two different intensities, and wherein said horizontal grid pattern generation means further comprises:
separate grid logic circuitry including a fifth register for storing a value indicative of the number of horizontal grid lines of one intensity per each horizontal grid line of a different intensity, and
a fourth accumulator for effectively counting the number of grid intensity control signals produced by said separate minor grid logic circuitry and for producing a major horizontal grid intensity control signal when said count corresponds to the value stored in said fifth register, said major horizontal grid intensity control signal being supplied to said graphics display unit for an entire horizontal video scan so as to produce background grid spots having the intensity of only one of said mutually different intensities.

12. A system according to claim 11 wherein said separate major grid logic circuitry further comprises:
a sixth register for providing a grid offset value and indicative of the number of horizontal grid lines of intensity established by said separate minor grid logic circuitry which are to be produced before the first horizontal grid line of intensity established by said separate major grid logic circuitry, and
means for presetting said fourth accumulator to the offset value from said sixth register at the beginning of each video frame.

13. A background grid generation system according to claim 1 wherein said vertical grid pattern generation means comprises:
a vertical grid pattern memory having a storage region corresponding to each picture element location in a horizontal scan line of said video graphics display unit,
grid data generation means for entering into said vertical grid pattern memory signals indicating the positions of requisite background vertical grid spots in a horizontal video scan line, and
video bit address logic for accessing said vertical grid pattern memory in unison with horizontal video scan clock pulses from said display unit, the output of said vertical grid pattern memory providing said grid pattern defining signals.

14. A system according to claim 13 wherein said horizontal grid pattern generation means comprises:

horizontal grid pattern logic, said grid data generation means entering into said horizontal grid pattern logic signals indicative of the horizontal grid line pattern to be generated, means for accessing said horizontal grid pattern logic in synchronism with successive horizontal line scanning of said video graphics display unit, said logic thereby providing said horizontal grid pattern defining signals.

15. A system according to claim 14 wherein said background grid has horizontal grid lines of at least two different intensities, the vertical locations of such horizontal grid lines of different intensity being indicated by signals entered into said horizontal grid pattern logic, and wherein said vertical grid pattern memory stores signals indicative of the horizontal positions of background grid spots associated with vertical background grid lines of at least first and second different intensities, said combinatorial logic means comprising logic circuitry for providing, during each horizontal video scan for which no horizontal grid line is to be produced, grid pattern defining signals designating a grid intensity in accordance with the accessed contents of said vertical grid pattern memory, and for providing, during each horizontal video scan for which a horizontal grid line is to be produced, a grid pattern defining signal designating a grid intensity in accordance with the output of said horizontal grid pattern logic.

16. A system according to claim 14 wherein said grid data generation means includes circuitry for entering into at least one of said vertical grid pattern memory and said horizontal grid pattern logic signals indicative of a grid pattern having non-linearly spaced grid lines.

17. A system according to claim 1 wherein said vertical grid pattern generation means produces vertical grid pattern defining signals having a first value indicating that no vertical background grid spot is to be produced, a second value indicating that a vertical background grid is to be produced, or a third value indicating that the horizontal grid pattern is to be inhibited, and wherein said combinatorial logic means produces grid intensity control signals that result in no background grid whenever said vertical grid pattern defining signals have said third value, regardless of whether or not a horizontal grid pattern defining signal is concurrently provided by said horizontal grid pattern generation.

18. A system according to claim 1 wherein said horizontal grid pattern generation means produces horizontal grid pattern defining signals having a first value indicating that no horizontal background grid spot is to be produced, a second value indicating that a horizontal background grid is to be produced, or a third value indicating that the vertical grid pattern is to be inhibited, and wherein said combinatorial logic means produces grid intensity control signals that result in no background grid whenever said horizontal grid pattern defining signals have said third value, regardless of whether or not a vertical grid pattern defining signal is concurrently provided by said vertical grid pattern generation means.

19. A system according to claim 1 wherein said horizontal grid pattern generation means comprises computational logic for algorithmically computing said horizontal grid pattern defining signals.

20. A system according to claim 1 wherein each of said vertical and horizontal grid pattern generation means produces multibit grid pattern defining signals, said combinatorial logic means being configured to utilize a certain bit of each such signal to establish which subset of bits of the other signal will be used to control production by said logic means of said grid intensity control signals.

21. An electronic background grid generation system for use with a raster-type video graphics display unit on which graphic data is displayed, comprising:

a vertical grid pattern memory having a storage region corresponding to each picture element location in one horizontal scan line of said video graphics display unit, said memory containing data indicative of a desired pattern of individual picture element spot intensities to be produced in each picture element location along a horizontal scan line of said display unit, and first means for reading out the contents of said vertical grid pattern memory and for converting said read out contents to grid intensity control signals for said video graphics display unit in synchronism with the horizontal video scanning thereof.

22. An electronic background grid generation system according to claim 21 further comprising:

alteration means for altering the addresses from which the contents of said vertical grid pattern memory are read out during said horizontal video scanning in response to changes in the displayed location of said graphic data, so that the generated background grid remains aligned with said displayed graphic data despite display relocation thereof.

23. An electronic background grid generation system according to claim 21 further comprising:

a horizontal grid pattern logic for providing data indicative of the desired vertical locations and relative intensities of horizontal grid lines, and second means for accessing the data provided by said horizontal grid pattern logic in synchronism with scanning of each horizontal scan line of said video graphics display unit and for modifying said grid intensity control signals in response to said accessed data.

24. An electronic background grid generation system according to claim 23 further comprising:

means for modifying the utilized contents of said vertical grid pattern memory and the data provided by horizontal grid pattern logic in response to changes in the display location or size of said displayed graphic data.

25. An electronic background grid generation system according to claim 23 wherein said second means includes combinatorial logic, cooperating with said first means, for combining both the read out contents of said vertical grid pattern memory and the accessed data provided by said horizontal grid pattern logic to produce said grid intensity control signals.

26. An electronic background grid generation system according to claim 23 wherein at least one of said read out contents and said accessed data includes an inhibit code, said combinatorial logic being configured to produce a grid intensity control signal that results in no background grid upon occurrence of an inhibit code.

27. An electronic background grid generation system according to claim 25 wherein each of said read out contents and said accessed data specifies a grid spot of different intensity or color, said combinatorial logic being configured to produce a grid intensity or color control signal in accordance with a selectable truth table.

28. An electronic background grid generation system according to claim 23 wherein said horizontal grid pattern logic comprises computational circuitry for providing said data by algorithmic calculation.

29. An alignable electronic background grid generation system for use with a raster-type graphics display unit on which graphic data is displayed, comprising:
- a vertical grid pattern generator,
- a horizontal grid pattern controller,
- a control means connected to said generator and said controller, for providing background grid parameter data thereto,
- said generator producing, in response to such provided data and in synchronism with horizontal video scanning of the display unit, grid intensity control signals indicating the requisite intensity of background grid spots at corresponding picture elements in the resultant display,
- said controller producing, in response to such provided data and in synchronism with vertical video scanning of the display unit, output signals for modifying said grid intensity control signals from said generator, the resultant modified intensity control signals being supplied to said graphics display unit for utilization thereby, and
- alteration means cooperating with said control means, for altering said supplied grid parameter data as the location or size of the displayed graphic data is changed, so that the resultant background grid will remain aligned with said displayed graphic data.

30. A system according to claim 29 further comprising:
- combinatorial logic means, cooperating with said generator and said controller, for modifying said grid intensity control signals from said generator in response to said controller output signals in accordance with a predetermined truth table set of combinatorial conditions.

31. An alignable electronic background grid generation system for use with a raster-type video graphics display unit on which graphic data is displayed, comprising:
- control means for supplying alterable grid pattern and offset data,
- vertical grid pattern generation means, cooperating with said control means and synchronized with the display unit horizontal video scan, for providing in response to said alterable grid pattern data vertical grid pattern defining signals indicative of requisite background grid spots at horizontal picture element locations corresponding to desired vertical background grid lines specified by said grid pattern data,
- horizontal grid pattern generation means, cooperating with said control means and synchronized with the display unit vertical line scan, for providing in response to said alterable grid pattern data horizontal grid pattern defining signals indicative of a desired horizontal grid line pattern specified by said grid pattern data,
- combinatorial logic means, cooperating with both said vertical and horizontal grid pattern generation means, for combining said provided vertical and horizontal grid pattern defining signals and producing as a result of said combination a set of grid intensity or color control signals, and
- mixing means, operatively connected to said combinatorial logic means, for non-exclusively mixing said grid intensity control signals with other video signals defining said graphic data being displayed so as to produce a composite display, utilizable by said video graphics display unit, in which said graphic data is concurrently overlayed on said background grid.

* * * * *